United States Patent
Lin et al.

(10) Patent No.: US 6,982,588 B1
(45) Date of Patent: Jan. 3, 2006

(54) INVERSE FUNCTION METHOD FOR SEMICONDUCTOR MIXER LINEARITY ENHANCEMENT

(75) Inventors: Heng-Chih Lin, Plano, TX (US); Chien-Chung Chen, Plano, TX (US); Ranjit Gharpurey, Ann Arbor, MI (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/869,680

(22) Filed: Jun. 16, 2004

(51) Int. Cl.
*G06G 7/44* (2006.01)
*G06G 7/16* (2006.01)

(52) U.S. Cl. .................... 327/359; 455/333
(58) Field of Classification Search .......... 327/359; 455/333
See application file for complete search history.

(56) References Cited

U.S. PATENT DOCUMENTS

| | | | | |
|---|---|---|---|---|
| 5,396,659 A | * | 3/1995 | Kimura | 455/333 |
| 5,576,653 A | * | 11/1996 | Kimura | 327/356 |
| 5,630,228 A | * | 5/1997 | Mittel | 455/333 |
| 5,708,383 A | * | 1/1998 | Lee | 327/356 |
| 5,774,010 A | * | 6/1998 | Kimura | 327/356 |
| 5,825,232 A | * | 10/1998 | Kimura | 327/356 |
| 5,936,466 A | * | 8/1999 | Andoh et al. | 330/253 |
| 6,370,372 B1 | * | 4/2002 | Molnar et al. | 455/323 |
| 6,876,843 B2 | * | 4/2005 | Madni et al. | 455/311 |

* cited by examiner

*Primary Examiner*—Kenneth B. Wells
*Assistant Examiner*—Khareem E. Almo
(74) *Attorney, Agent, or Firm*—Alan K. Stewart; W. James Brady, III; Frederick J. Telecky, Jr.

(57) ABSTRACT

The mixer circuit includes a differential rf input driver; a differential local oscillator input circuit coupled to the differential rf input driver; a non-linear load coupled to the differential local oscillator input circuit wherein the non-linear load compensates for non-linearity of the differential rf input driver. The non-linear load has a V-I (voltage-current) transfer function the inverse of the input driver. This improves the mixer linearity without sacrificing the Gain or Noise Figure.

6 Claims, 1 Drawing Sheet

INVERSE FUNCTION METHOD FOR SEMICONDUCTOR MIXER LINEARITY ENHANCEMENT

FIELD OF THE INVENTION

The present invention relates to electronic circuitry and, in particular, to semiconductor mixer circuits.

BACKGROUND OF THE INVENTION

A semiconductor mixer's linearity is crucial to the overall linearity of RF transceiver links, and thus crucial to its ability to reject the interferers. A traditional prior art Gilbert-cell active mixer uses linear semiconductor resistor load in conjunction with the non-linear V-I (voltage-current) input drivers. The linearity is limited by how good you can linearize the input drivers and how much other performance loss (Gain, Noise Figure, etc.) you are willing to trade.

Mixers play an important role in the wireless transceiver chain. It follows the Low Noise Amplifier (LNA) or possibly image rejection filter, translates the RF signal to the IF or baseband signal, and sends the (amplified) signal to the next stage. The linearity of the mixer is a critical parameter as unwanted interferers, if not significantly attenuated, might be mixed down to the band of interest. Besides linearity, Noise Figure (NF) and gain are two other important characteristics of a mixer as they are part of the factors to determine the overall receiver noise figure and sensitivity.

Traditionally, mixers can be classified to two categories: active mixer and passive mixer. A passive mixer provides a better linearity at the cost of gain and higher noise figure for the subsequent stages. Active mixers, on the other hand, are usually configured as double balanced current steering topologies with linear resistor loads R22 and R23 as shown in FIG. 1. The prior art device shown in FIG. 1 includes resistor loads R22 and R23; transistors MN20, MN21, MN22, MN23, MN24, MN25, and MN26; current source idc; resistive devices 20 and 21; capacitors C4 and C5; LO (local oscillator) inputs LO_P and LO_M; differential outputs IF_P and IF_M; RF inputs RF_P and RF_M, current reference input IREF; and source voltages AVDD and AVSS. Differential local oscillator inputs LO_P and LO_M control transistors MN20, MN21, MN22, and MN23 (differential local oscillator input circuit). The major non-linearity is caused by the nonlinear V-I (voltage-current) conversion in the differential input driver (NMOS transistors MN24 and MN25) where the square-law relation of MOS's drain current to the VGS causes the drain current, thus the output voltage (outputs IF_P and IF_M), to be quadratically related to the input voltage (inputs RF_P and RF_M). Even though it has been shown that the differential output voltage is still a linear function of the differential input voltage if the input common mode voltage is a constant and the quadratic I-V (current-voltage) relationship is valid, the RF input common mode voltage cannot be guaranteed to be a constant due to the LO kickback and parasitic coupling. Furthermore, the deep sub-micron CMOS technology cannot guarantee the quadratic I-V relationship.

Many schemes have been employed to correct for or linearize the non-linearity of the input driver's V-I characteristic. For example, source degeneration, which trades linearity with higher noise figure if resistor is used, or larger silicon area if inductor is used. However, when looking into the fundamental problem of this non-linearity, it is the input driver's nonlinear V-I conversion vs. the linear load resistor's linear I-V conversion. Most prior art solutions have just tried to linearize the input driver's V-I conversion.

SUMMARY OF THE INVENTION

The mixer circuit includes a differential rf input driver; a differential local oscillator input circuit coupled to the differential rf input driver; a non-linear load coupled to the differential local oscillator input circuit wherein the non-linear load compensates for non-linearity of the differential rf input driver. The non-linear load has a V-I (voltage-current) transfer function the inverse of the input driver. This improves the mixer linearity without sacrificing the Gain or Noise Figure.

DETAILED DESCRIPTION OF PREFERRED EMBODIMENTS

The present invention increases the mixer linearity without trading the other performances by using two inverse functions to get the linearity. Prior art solutions use linear semiconductor resistor loads in conjunction with the non-linear V-I input drivers and try to linearize the input drivers at the cost of the other performance (Gain, Noise Figure, etc.) degradations.

The present invention provides a method to increase the mixer linearity without trading the other performances. By incorporating a nonlinear load with V-I transfer function the inverse of the input driver, the mixer linearity is improved significantly without sacrificing the Gain or Noise Figure.

Nevertheless, the goal of the present invention is to linearize the differential $V_{out}$ vs. differential $V_{in}$ relationship. Therefore, if a non-linear load is used, which exactly compensates for the non-linearity of the input stage, the output voltage should be a linear function of the input voltage. Thus if the current-voltage relation of the input stage non-linearity is given by $I=f(V_{in})$, where f is a non-linear function, and the load has a voltage-current relation given by $V=Kf^{-1}(I)$, then $V=KV_{in}$. A preferred embodiment solution that exhibits such behavior is shown in FIG. 2, where PMOS devices MP20 and MP21 are used as diodes.

Figure 1:
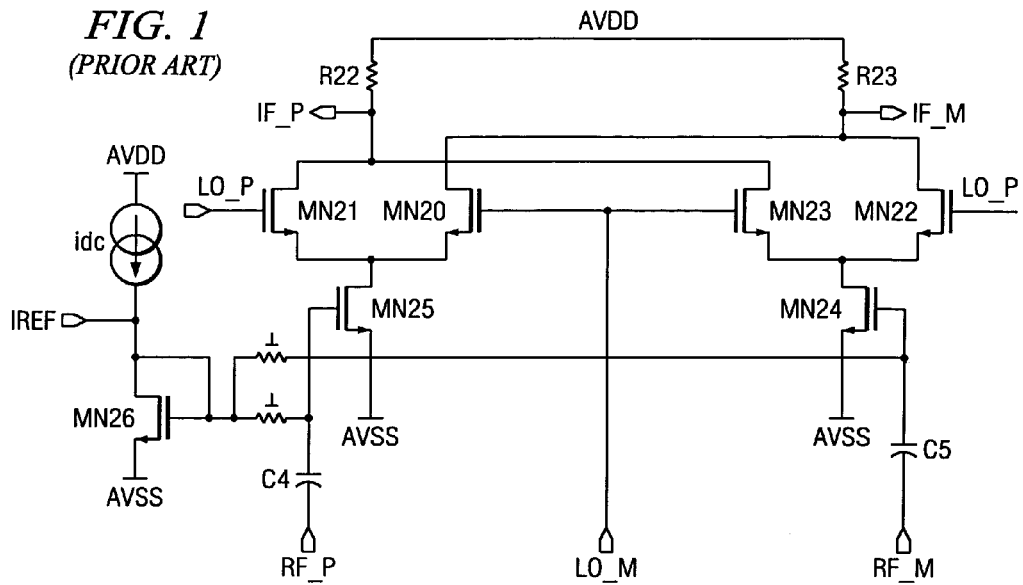
FIG. 1 is a circuit diagram of a prior art active mixer configured as a double balanced current steering topology with linear resistor loads.
Figure 2:
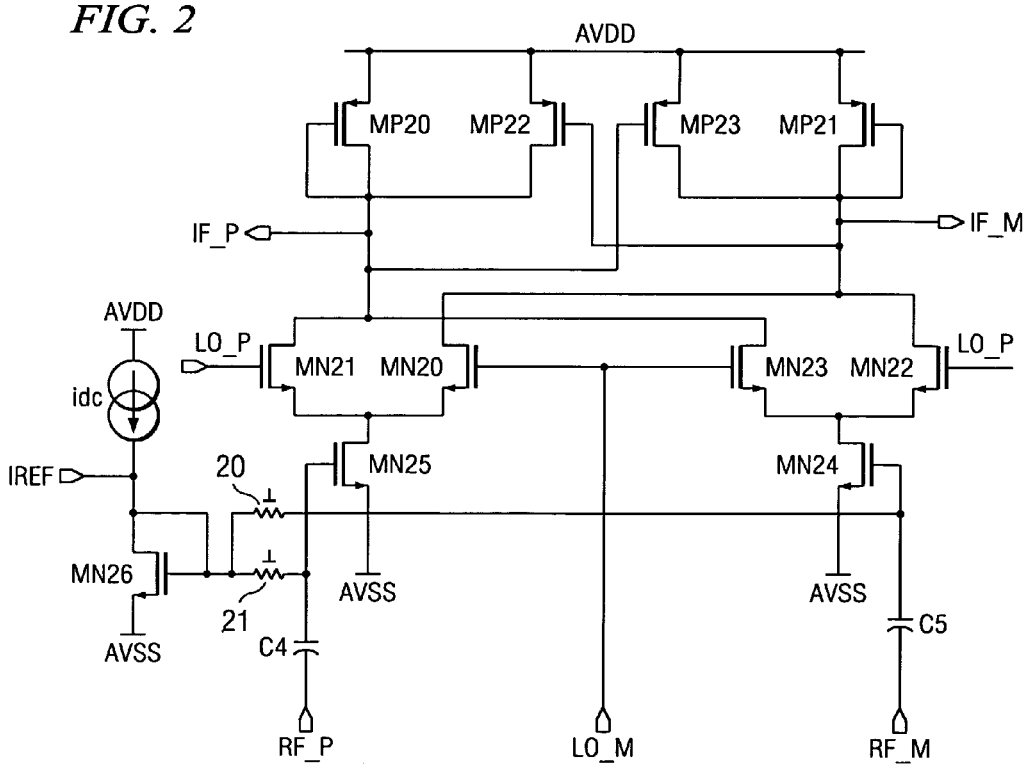
FIG. 2 is a circuit diagram of a preferred embodiment active mixer configured as a double balanced current steering topology with non-linear loads.

In the preferred embodiment circuit of FIG. 2 the resistor loads R22 and R23, of the prior art circuit of FIG. 1, have been replaced by PMOS transistors MP20, MP21, MP22, and MP23, which form PMOS loads. The assumption is that the PMOS non-linearity is identical or similar to the NMOS non-linearity of transistors MN24 and MN25, which is typically the case. Note that the PMOS loads in FIG. 2 include cross-coupled devices MP22 and MP23, which increase the differential gain of the mixer.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description.

It is therefore intended that the appended claims encompass any such modifications or embodiments.

What is claimed is:

1. A mixer circuit comprising:
   a differential rf input driver;
   a differential local oscillator input circuit coupled to the differential rf input driver;
   a non-linear load coupled to the differential local oscillator input circuit wherein the non-linear load compensates for non-linearity of the differential rf input driver;
   wherein the non-linear load comprises a first diode-connected PMOS transistor coupled to the differential local oscillator input circuit and a second diode-connected PMOS transistor coupled to the differential local oscillator input circuit;
   wherein the non-linear load further comprises two cross-coupled PMOS transistors.

2. The circuit of claim 1 wherein the differential rf input driver comprises NMOS transistors and the non-linear load comprises PMOS transistors.

3. The circuit of claim 1 wherein the differential local oscillator input circuit comprises NMOS transistors.

4. The circuit of claim 1 wherein the differential local oscillator circuit comprises first and second NMOS transistors coupled to the first diode-connected PMOS transistor, and third and fourth NMOS transistors coupled to the second diode-connected PMOS transistor, wherein the first and fourth NMOS transistors are controlled by a positive differential input node, and the second and third NMOS transistors are controlled by a negative differential input node.

5. The circuit of claim 1 wherein the differential rf input driver comprises a fifth NMOS transistor coupled to the first and second NMOS transistors such that the first NMOS transistor is coupled between the first diode-connected PMOS transistor and the fifth NMOS transistor, and the second NMOS transistor is coupled between the second diode-connected PMOS transistor and the fifth NMOS transistor, and a sixth NMOS transistor coupled to the third and fourth NMOS transistors such that the third NMOS transistor is coupled between the first diode-connected PMOS transistor and the sixth NMOS transistor, and the fourth NMOS transistor is coupled between the second diode-connected PMOS transistor and the sixth NMOS transistor.

6. The circuit of claim 1 wherein the non-linear load further comprises a first cross-coupled PMOS transistor coupled in parallel with the first diode-connected PMOS transistor, and a second cross-coupled PMOS transistor coupled in parallel with the second diode-connected PMOS transistor.

* * * * *